United States Patent
Nishida et al.

(10) Patent No.: US 12,211,689 B2
(45) Date of Patent: Jan. 28, 2025

(54) METHOD OF MANUFACTURING SEMICONDUCTOR DEVICE CAPABLE OF CONTROLLING FILM THICKNESS DISTRIBUTION

(71) Applicant: KOKUSAI ELECTRIC CORPORATION, Tokyo (JP)

(72) Inventors: Keigo Nishida, Toyama (JP); Takashi Ozaki, Toyama (JP); Takafumi Sasaki, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 791 days.

(21) Appl. No.: 17/204,201

(22) Filed: Mar. 17, 2021

(65) Prior Publication Data

US 2021/0202232 A1 Jul. 1, 2021

Related U.S. Application Data

(63) Continuation of application No. PCT/JP2018/035147, filed on Sep. 21, 2018.

(51) Int. Cl.
*H01L 21/02* (2006.01)
*C23C 16/455* (2006.01)
(Continued)

(52) U.S. Cl.
CPC .... *H01L 21/0223* (2013.01); *C23C 16/45574* (2013.01); *C23C 16/52* (2013.01); *H01L 21/67023* (2013.01); *H01L 21/67253* (2013.01)

(58) Field of Classification Search
CPC .......... H01L 21/0223; H01L 21/67023; C23C 16/45574; C23C 16/52
(Continued)

(56) References Cited

U.S. PATENT DOCUMENTS 9,425,071 B2 * 8/2016 Yabe ................. H01L 21/022
10,351,952 B2 * 7/2019 Yabe ................. C23C 16/4412
(Continued)

FOREIGN PATENT DOCUMENTS

JP 07-066193 A 3/1995
JP 2002-176052 A 6/2002
(Continued)

OTHER PUBLICATIONS

Japanese Office Action issued on Jan. 13, 2022 for Japanese Patent Application No. 2020-547591.

*Primary Examiner* — Jami Valentine Miller
(74) *Attorney, Agent, or Firm* — Volpe Koenig

(57) ABSTRACT

Described herein is a technique capable of improving a controllability of a thickness distribution of an oxide film formed on a surface of a substrate. According to one aspect of the technique, there is provided a method of manufacturing a semiconductor device, including: (a) forming a first oxide layer by supplying an oxygen-containing gas and an hydrogen-containing gas to a heated substrate at a first pressure less than an atmospheric pressure and by oxidizing a surface of the substrate; and (b) forming a second oxide layer by supplying the oxygen-containing gas and the hydrogen-containing gas to the heated substrate at a second pressure less than the atmospheric pressure and different from the first pressure and by oxidizing the surface of the substrate on which the first oxide layer is formed.

18 Claims, 8 Drawing Sheets

(51) Int. Cl.
*C23C 16/52* (2006.01)
*H01L 21/67* (2006.01)

(58) Field of Classification Search
USPC .......................................................... 438/770
See application file for complete search history.

(56) References Cited

U.S. PATENT DOCUMENTS

| | | |
|---|---|---|
| 2002/0127873 A1 | 9/2002 | Sato et al. |
| 2006/0003542 A1 | 1/2006 | Suzuki et al. |
| 2007/0157882 A1 | 7/2007 | Ozaki et al. |
| 2009/0233452 A1 | 9/2009 | Ozaki et al. |
| 2011/0306212 A1* | 12/2011 | Sato .................. C23C 16/325 |
| | | 156/345.24 |
| 2015/0318170 A1* | 11/2015 | Yabe .................. C23C 16/402 |
| | | 438/770 |

FOREIGN PATENT DOCUMENTS

| | | |
|---|---|---|
| JP | 2006-041482 A | 2/2006 |
| JP | 2006-120965 A | 5/2006 |
| JP | 2009-135546 A | 6/2009 |
| JP | 2011-258787 A | 12/2011 |
| JP | 2013-197421 A | 9/2013 |
| JP | 5325363 B | 10/2013 |
| JP | 2014-187393 A | 10/2014 |
| JP | 6199570 B | 9/2017 |
| WO | 2005/020309 A1 | 3/2005 |

\* cited by examiner

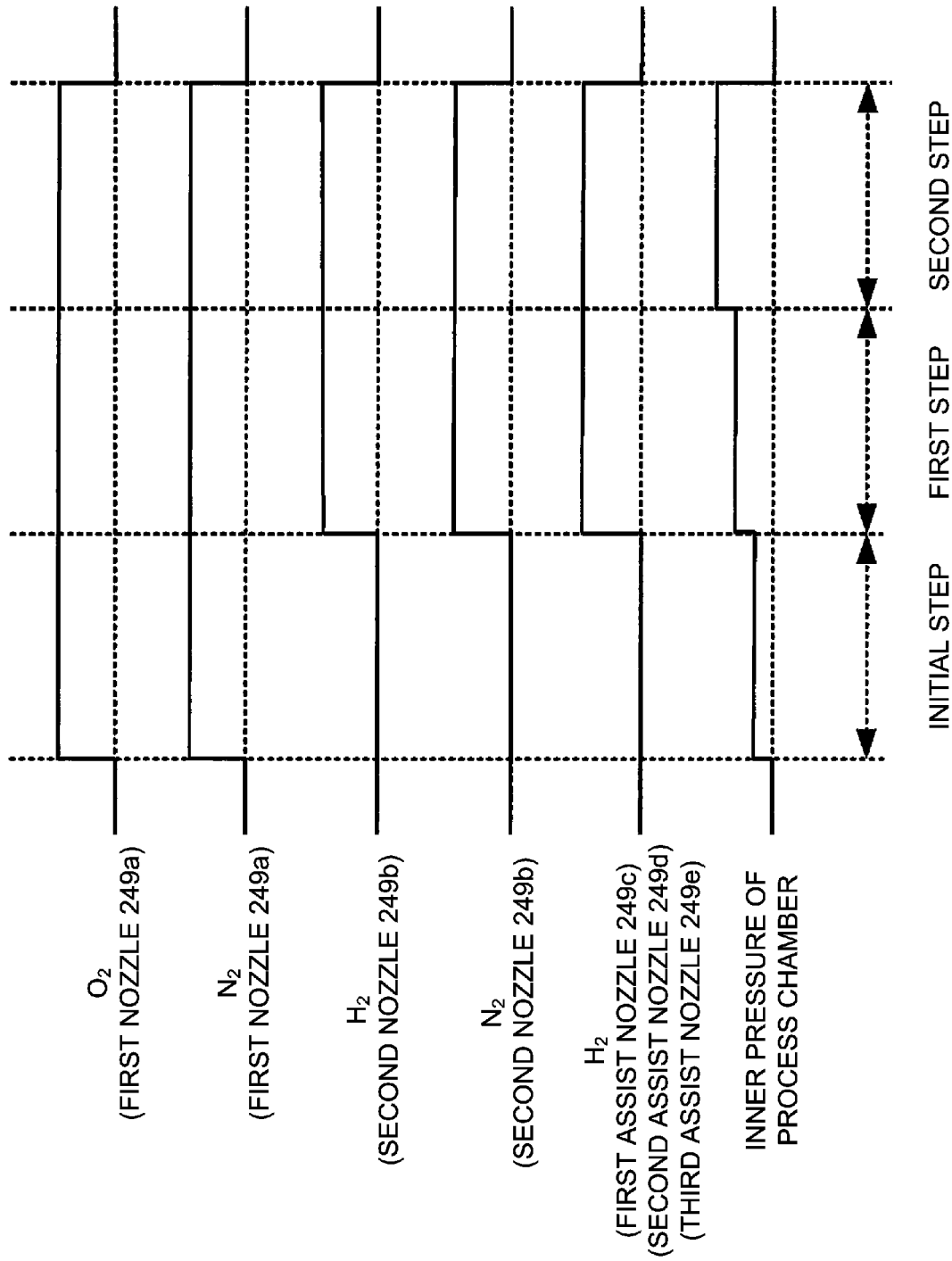

52.816    53.361
+1.02 %

54.666    57.241
+4.62 %

52.935    53.458
-0.98 %

55.848    57.915
+3.64 %

52.562    53.469
-1.70 %

54.368    57.068
+6.00 %

METHOD OF MANUFACTURING SEMICONDUCTOR DEVICE CAPABLE OF CONTROLLING FILM THICKNESS DISTRIBUTION

CROSS-REFERENCE TO RELATED PATENT APPLICATION

This non-provisional U.S. patent application claims priority under 35 U.S.C. § 119 of International Application No. PCT/JP2018/035147, filed on Sep. 21, 2018, in the WIPO, the entire contents of which are hereby incorporated by reference.

1. Field

The present disclosure relates to a method of manufacturing a semiconductor device, a substrate processing apparatus and a non-transitory computer-readable recording medium.

2. Description of the Related Art

As a part of a manufacturing process of a semiconductor device, a process of forming an oxide film on a surface of a substrate by supplying an oxygen-containing gas to the substrate in a process chamber.

However, according to related arts, it may be difficult to uniformize a thickness distribution of the oxide film formed on the surface of the substrate.

SUMMARY

Described herein is a technique capable of improving a controllability of a thickness distribution of an oxide film formed on a surface of a substrate.

According to one aspect of the technique of the present disclosure, there is provided a method of manufacturing a semiconductor device, including: (a) forming a first oxide layer by supplying an oxygen-containing gas and an hydrogen-containing gas to a heated substrate at a first pressure less than an atmospheric pressure and by oxidizing a surface of the substrate; and (b) forming a second oxide layer by supplying the oxygen-containing gas and the hydrogen-containing gas to the heated substrate at a second pressure less than the atmospheric pressure and different from the first pressure and by oxidizing the surface of the substrate on which the first oxide layer is formed.

BRIEF DESCRIPTION OF THE DRAWINGS

FIG. 4 is a timing diagram schematically illustrating a gas supply used in a substrate processing according to the embodiments described herein.

DETAILED DESCRIPTION

Embodiments

Hereinafter, one or more embodiments (also simply referred to as "embodiments") according to the technique of the present disclosure will be described with reference to the drawings.

Hereinafter, the embodiments will be described with reference to FIGS. 1 through 4. A substrate processing apparatus is configured as an example of an apparatus used in a manufacturing process of a semiconductor device.

(1) Configuration of Substrate Processing Apparatus

Figure 1:
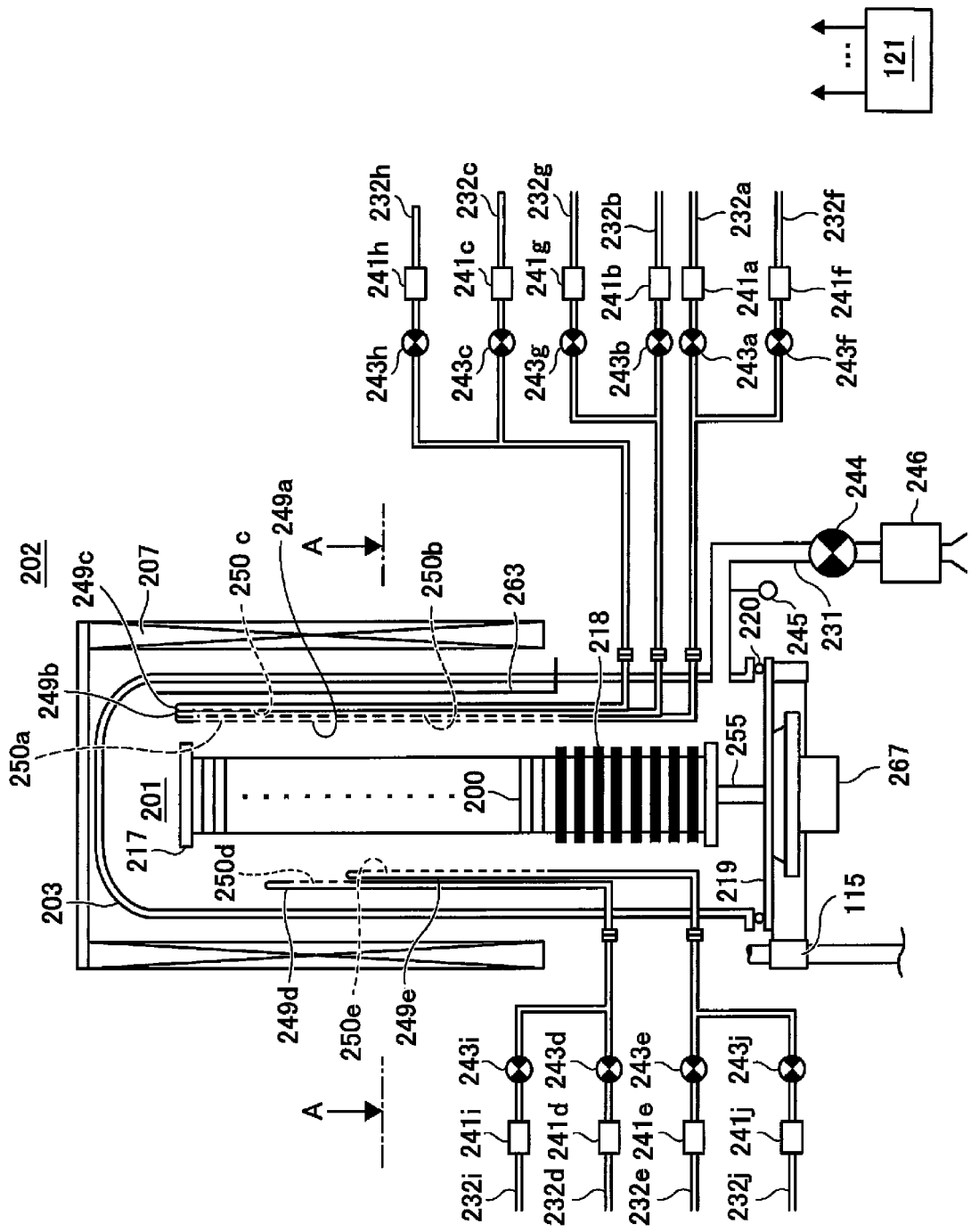
FIG. 1 is a diagram schematically illustrating a vertical cross-section of a process furnace of a substrate processing apparatus according to one or more embodiments described herein.
Figure 2:
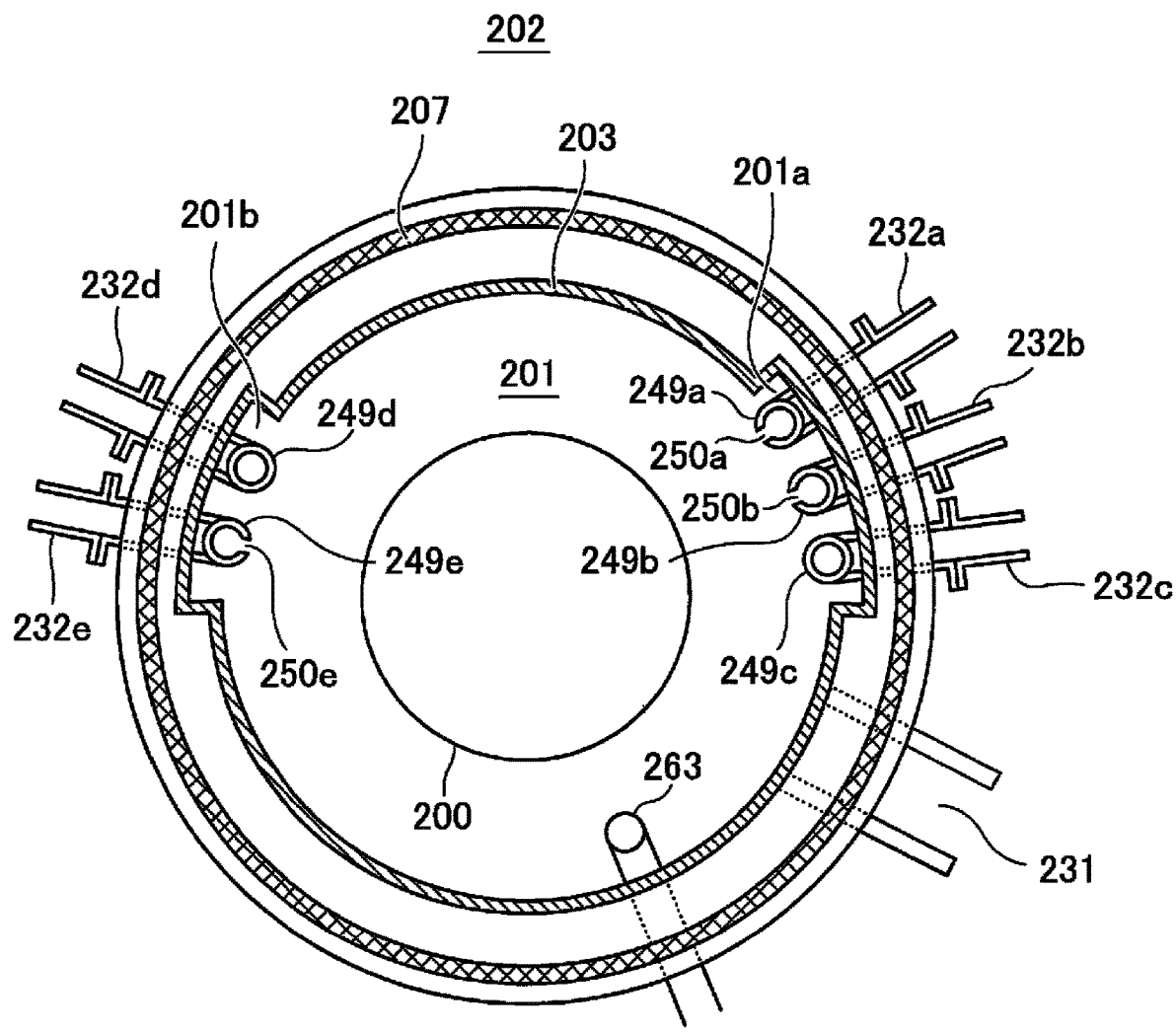
FIG. 2 is a diagram schematically illustrating a horizontal cross-section taken along the line A-A of the process furnace of the substrate processing apparatus shown in FIG. 1.

FIG. 1 is a diagram schematically illustrating a configuration of a vertical type process furnace 202 of the substrate processing apparatus preferably used in the present embodiments in order to perform a method of manufacturing the semiconductor device, and schematically illustrates a vertical cross-section of the process furnace 202. FIG. 2 is a diagram schematically illustrating the configuration of the vertical type process furnace 202 of the substrate processing apparatus preferably used in the present embodiments, and schematically illustrates a horizontal cross-section taken along the line A-A of the process furnace 202.

As shown in FIG. 1, the process furnace 202 includes a heater 207 serving as a heating apparatus (heating structure). The heater 207 is of a cylindrical shape, and is vertically installed while being supported by a heater base (not shown). As described later, the heater 207 also functions as an activator (which is an activation structure) capable of activating a gas such as an oxygen-containing gas and a hydrogen-containing gas by heat.

A reaction tube 203 is provided at an inner side of the heater 207 to be aligned in a manner concentric with the heater 207. For example, the reaction tube 203 is made of a heat resistant material such as quartz ($SiO_2$) and silicon carbide (SiC). The reaction tube 203 is of a cylindrical shape with a closed upper end and an open lower end. A process chamber 201 is provided in a hollow cylinder of the reaction tube 203. The process chamber 201 is configured to accommodate a plurality of wafers including a wafer 200 serving as a substrate. Hereinafter, the plurality of the wafers including the wafer 200 may also be simply referred to as wafers 200. The wafer 200 is processed in the process chamber 201.

A first nozzle 249a, a second nozzle 249b, a first assist nozzle 249c, a second assist nozzle 249d and a third assist nozzle 249e are provided in the process chamber 201 so as to penetrate a lower side wall of the reaction tube 203. A first gas supply pipe 232a and a second gas supply pipe 232b are connected to the first nozzle 249a and the second nozzle 249b, respectively. A third gas supply pipe 232c, a fourth gas supply pipe 232d and a fifth gas supply pipe 232e are connected to the first assist nozzle 249c, the second assist nozzle 249d and the third assist nozzle 249e, respectively.

Each of the first nozzle 249a, the second nozzle 249b, the first assist nozzle 249c, the second assist nozzle 249d and the third assist nozzle 249e is configured as an L-shaped nozzle. A horizontal portion of each of the first nozzle 249a, the second nozzle 249b, the first assist nozzle 249c, the second assist nozzle 249d and the third assist nozzle 249e is installed so as to penetrate the lower side wall of the reaction tube 203. A vertical portion of each of the first nozzle 249a, the second nozzle 249b and the first assist nozzle 249c is installed in a spare chamber 201a of a groove shape protruding outward in a radial direction of the reaction tube 203 and extending in the vertical direction. That is, the vertical portion of each of the first nozzle 249a, the second nozzle 249b and the first assist nozzle 249c is installed in the spare chamber 201a toward the upper end of the reaction tube 203 (in a direction in which the wafers 200 are arranged) along an inner wall of the reaction tube 203. The vertical portion of the first assist nozzle 249c is provided adjacent to the first nozzle 249a and the second nozzle 249b. A vertical portion of each of the second assist nozzle 249d and the third assist nozzle 249e is installed in a spare chamber 201b of a groove shape protruding outward in the radial direction of the reaction tube 203 and extending in the vertical direction similar to the spare chamber 201a. That is, the vertical portion of each of the second assist nozzle 249d and the third assist nozzle 249e is installed in the spare chamber 201b toward the upper end of the reaction tube 203 (in the direction in which the wafers 200 are arranged) along the inner wall of the reaction tube 203. The vertical portions of the second assist nozzle 249d and the third assist nozzle 249e are provided adjacent to each other.

The first nozzle 249a and the second nozzle 249b are provided so as to extend from a lower region of the process chamber 201 to an upper region of the process chamber 201. The first nozzle 249a and the second nozzle 249b are provided with a plurality of gas supply holes 250a and a plurality of gas supply holes 250b, respectively. The gas supply holes 250a and the gas supply holes 250b are disposed at positions facing the wafers 200 at heights from a lower region to an upper region of a boat 217 from a lower region to an upper region of the reaction tube 203. An opening area of each the gas supply holes 250a and the gas supply holes 250b is the same, and each of the gas supply holes 250a and the gas supply holes 250b is provided at the same pitch.

The first assist nozzle 249c is provided so as to extend from the lower region of the process chamber 201 to the upper region of the process chamber 201. The first assist nozzle 249c is provided with a plurality of gas supply holes 250c. The gas supply holes 250c are disposed at positions facing the wafers 200 arranged in the upper region of the boat 217 at heights corresponding to an upper region of the first assist nozzle 249c in an extension direction of the first assist nozzle 249c. An opening area of each of the gas supply holes 250c is the same, and each of the gas supply holes 250c is provided at the same pitch. Therefore, the gas supplied into the process chamber 201 through the gas supply holes 250c of the first assist nozzle 249c is supplied to the wafers 200 accommodated in the upper region of the boat 217.

The second assist nozzle 249d is provided so as to extend from the lower region of the process chamber 201 to a central region of the process chamber 201. The second assist nozzle 249d is provided with a plurality of gas supply holes 250d. The gas supply holes 250d are disposed at positions facing the wafers 200 arranged in the central region of the boat 217 at heights below the gas supply holes 250c of the first assist nozzle 249c and above a plurality of gas supply holes 250e of the third assist nozzle 249e described later. An opening area of each of the gas supply holes 250d is the same, and each of the gas supply holes 250d is provided at the same pitch. Therefore, the gas supplied into the process chamber 201 through the gas supply holes 250d of the second assist nozzle 249d is supplied to the wafers 200 accommodated in the central region of the boat 217.

The third assist nozzle 249e is provided so as to extend in the lower region of the process chamber 201. The third assist nozzle 249e is provided with the gas supply holes 250e. The gas supply holes 250e are disposed at positions facing the wafers 200 arranged in the lower region of the boat 217 at heights below the gas supply holes 250d of the second assist nozzle 249d. An opening area of each of the gas supply holes 250e is the same, and each of the gas supply holes 250e is provided at the same pitch. Therefore, the gas supplied into the process chamber 201 through the gas supply holes 250e of the third assist nozzle 249e is supplied to the wafers 200 accommodated in the lower region of the boat 217.

That is, lengths (heights) of the first assist nozzle 249c, the second assist nozzle 249d and the third assist nozzle 249e in the process chamber 201 are different from one another, and at least a part of the positions of the gas supply holes 250c through 250e provided in each assist nozzle in a height direction (positions in the extension direction of each assist nozzle) are different from one another.

Mass flow controllers 241a, 241b, 241c, 241d and 241e serving as flow rate controllers (flow rate control structures) and valves 243a, 243b, 243c, 243d and 243e serving as opening/closing valves are sequentially installed at the first gas supply pipe 232a, the second gas supply pipe 232b, the third gas supply pipe 232c, the fourth gas supply pipe 232d and the fifth gas supply pipe 232e, respectively. Further, a first inert gas supply pipe 232f, a second inert gas supply pipe 232g, a third inert gas supply pipe 232h, a fourth inert gas supply pipe 232i and a fifth inert gas supply pipe 232j are connected to the first gas supply pipe 232a, the second gas supply pipe 232b, the third gas supply pipe 232c, the fourth gas supply pipe 232d and the fifth gas supply pipe 232e, respectively. Mass flow controllers 241f, 241g, 241h, 241i and 241j and valves 243f, 243g, 243h, 243i and 243j are sequentially installed at the first inert gas supply pipe 232f, the second inert gas supply pipe 232g, the third inert gas supply pipe 232h, the fourth inert gas supply pipe 232i and the fifth inert gas supply pipe 232j, respectively.

A first gas supplier (which is a first gas supply system) is constituted mainly by the first gas supply pipe 232a, the MFC 241a and the valve 243a. The first gas supplier may further include the first nozzle 249a. A first inert gas supplier (which is a first inert gas supply system) is constituted mainly by the first inert gas supply pipe 232f, the MFC 241f and the valve 243f.

A second gas supplier (which is a second gas supply system) is constituted mainly by the second gas supply pipe 232b, the MFC 241b and the valve 243b. The second gas supplier may further include the second nozzle 249b. A second inert gas supplier (which is a second inert gas supply system) is constituted mainly by the second inert gas supply pipe 232g, the MFC 241g and the valve 243g.

A first assist gas supplier (which is a first assist gas supply system) is constituted mainly by the third gas supply pipe 232c, the MFC 241c and the valve 243c. The first assist gas supplier may further include the first assist nozzle 249c. A third inert gas supplier (which is a third inert gas supply system) is constituted mainly by the third inert gas supply pipe 232h, the MFC 241h and the valve 243h.

A second assist gas supplier (which is a second assist gas supply system) is constituted mainly by the fourth gas supply pipe 232d, the MFC 241d and the valve 243d. The second assist gas supplier may further include the second assist nozzle 249d. A fourth inert gas supplier (which is a fourth inert gas supply system) is constituted mainly by the fourth inert gas supply pipe 232i, the MFC 241i and the valve 243i.

A third assist gas supplier (which is a third assist gas supply system) is constituted mainly by the fifth gas supply pipe 232e, the MFC 241e and the valve 243e. The third assist gas supplier may further include the third assist nozzle 249e. A fifth inert gas supplier (which is a fifth inert gas supply system) is constituted mainly by the fifth inert gas supply pipe 232j, the MFC 241j and the valve 243j. Each of the first inert gas supplier through the fifth inert gas supplier also function as a purge gas supplier (which is a purge gas supply system).

The oxygen-containing gas serving as an oxidizing gas (oxidation gas), for example, oxygen gas ($O_2$ gas), is supplied into the process chamber 201 through the first gas supply pipe 232a provided with the MFC 241a and the valve 243a and the first nozzle 249a. That is, the first gas supplier is configured as an oxygen-containing gas supplier (which is an oxygen-containing gas supply system) capable of supplying the oxygen-containing gas into the process chamber 201. Simultaneously with the supply of the oxygen-containing gas, an inert gas may be supplied through the first inert gas supply pipe 232f into the first gas supply pipe 232a.

The hydrogen-containing gas serving as a reducing gas, for example, hydrogen gas ($H_2$ gas), is supplied into the process chamber 201 through the second gas supply pipe 232b provided with the MFC 241b and the valve 243b and the second nozzle 249b. That is, the second gas supplier is configured as a hydrogen-containing gas supplier (which is a hydrogen-containing gas supply system) capable of supplying the hydrogen-containing gas into the process chamber 201. Simultaneously with the supply of the hydrogen-containing gas, the inert gas may be supplied through the second inert gas supply pipe 232g into the second gas supply pipe 232b.

The hydrogen-containing gas serving as the reducing gas, for example, the hydrogen gas ($H_2$ gas), is supplied into the process chamber 201 through each of the third gas supply pipe 232c, the fourth gas supply pipe 232d and the fifth gas supply pipe 232e via the first assist nozzle 249c, the second assist nozzle 249d and the third assist nozzle 249e. That is, each of the first assist nozzle 249c, the second assist nozzle 249d and the third assist nozzle 249e is used as a hydrogen gas nozzle through which the $H_2$ gas is supplied into the process chamber 201. Each of the first assist gas supplier, the second assist gas supplier and the third assist gas supplier functions as a hydrogen gas supplier (which is a hydrogen gas supply system).

The inert gas, for example, nitrogen gas ($N_2$ gas), is supplied into the process chamber 201 through each of the third inert gas supply pipe 232h, the fourth inert gas supply pipe 232i and the fifth inert gas supply pipe 232j via the first assist nozzle 249c, the second assist nozzle 249d and the third assist nozzle 249e. That is, each of the first assist nozzle 249c, the second assist nozzle 249d and the third assist nozzle 249e is also used as an inert gas nozzle through which the $N_2$ gas is supplied into the process chamber 201. Each of the first assist gas supplier, the second assist gas supplier and the third assist gas supplier functions as an inert gas supplier (which is an inert gas supply system). According to the present embodiments, each of the first assist gas supplier, the second assist gas supplier and the third assist gas supplier functions as the inert gas supplier by adjusting a flow rate ratio of the $N_2$ gas in the $H_2$ gas supplied through the first assist nozzle 249c, the second assist nozzle 249d and the third assist nozzle 249e.

An exhaust pipe 231 through which an inner atmosphere of the process chamber 201 is exhausted is provided at the lower side wall of the reaction tube 203. A vacuum pump 246 serving as a vacuum exhaust apparatus is connected to the exhaust pipe 231 through a pressure sensor 245 and an APC (Automatic Pressure Controller) valve 244. The pressure sensor 245 serves as a pressure detector (pressure detection device) to detect an inner pressure of the process chamber 201, and the APC valve 244 serves as a pressure regulator (pressure adjusting device). An exhauster (which is an exhaust system) is constituted mainly by the exhaust pipe 231, the APC valve 244 and the pressure sensor 245. The exhauster may further include the vacuum pump 246. The exhauster is configured to vacuum-exhaust the inner atmosphere of the process chamber 201 until the inner pressure of the process chamber 201 reaches and is maintained at a predetermined pressure (vacuum degree) by adjusting an opening degree of the APC valve 244 based on pressure information detected by the pressure sensor 245 with the vacuum pump 246 in operation.

A seal cap 219 serving as a furnace opening lid capable of airtightly sealing a lower end opening of the reaction tube 203 is provided under the reaction tube 203. An O-ring 220 serving as a seal provided on an upper surface of the seal cap 219 so as to be in contact with the lower end of the reaction tube 203. A rotator 267 configured to rotate the boat 217 described later serving as a substrate retainer is provided under the seal cap 219 opposite to the process chamber 201. A rotating shaft 255 of the rotator 267 is connected to the boat 217 through the seal cap 219. As the rotator 267 rotates the boat 217, the wafers 200 supported by the boat 217 are rotated. A boat elevator 115 is configured to elevate and lower the seal cap 219. When the seal cap 219 is elevated or lowered by the boat elevator 115, the boat 217 may be transferred (loaded) into the process chamber 201 or transferred (unloaded) out of the process chamber 201.

For example, the boat 217 is made of a heat resistant material such as quartz and silicon carbide. The boat 217 is configured to support the wafers 200 in a multistage manner while the wafers 200 are horizontally oriented with their centers aligned with each other. A heat insulator 218 is provided under the boat 217. For example, the heat insulator 218 is made of a heat resistant material such as quartz and silicon carbide.

As shown in FIG. 2, a temperature sensor 263 serving as a temperature detector is provided in the reaction tube 203. The state of electric conduction to the heater 207 is adjusted based on temperature information detected by the temperature sensor 263 such that a desired temperature distribution of the inner temperature of the process chamber 201 can be obtained.

Figure 3:
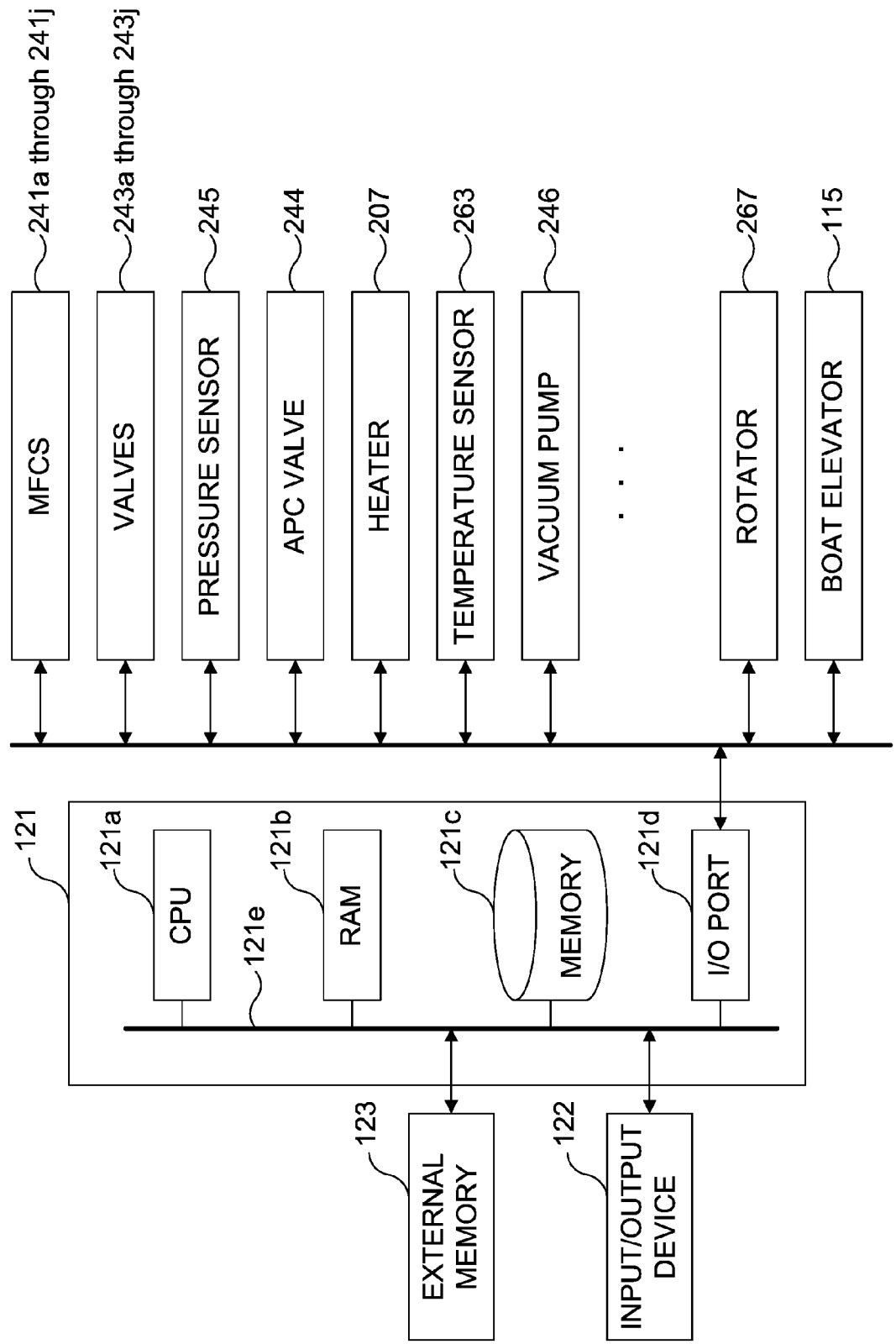
FIG. 3 is a block diagram schematically illustrating a configuration of a controller and related components of the substrate processing apparatus described herein.

As shown in FIG. 3, a controller 121 serving as a control device (control structure) is constituted by a computer including a CPU (Central Processing Unit) 121a, a RAM (Random Access Memory) 121b, a memory 121c and an I/O port 121d. The RAM 121b, the memory 121c and the I/O port 121d may exchange data with the CPU 121a through an internal bus 121e. For example, an input/output device 122 such as a touch panel is connected to the controller 121.

The memory 121c is configured by components such as a flash memory and a hard disk drive (HDD). For example, a control program configured to control the operation of the substrate processing apparatus or a process recipe containing information on the sequences and conditions of a substrate processing such as a film-forming process described later is readably stored in the memory 121c. The process recipe is obtained by combining steps of the substrate processing such as the film-forming process described later such that the controller 121 can execute the steps to acquire a predetermine result, and functions as a program. Hereafter, the process recipe and the control program may be collectively or individually referred to as a "program". In the present specification, the term "program" may indicate the process recipe alone, may indicate the control program alone, or may indicate both of the process recipe and the control program. The RAM 121b functions as a memory area (work area) where a program or data read by the CPU 121a is temporarily stored.

The I/O port 121d is connected to the above-described components such as the MFCs 241a through 241j, the valves 243a through 243j, the pressure sensor 245, the APC valve 244, the vacuum pump 246, the heater 207, the temperature sensor 263, the rotator 267 and the boat elevator 115.

The CPU 121a is configured to read the control program from the memory 121c and execute the read control program. In addition, the CPU 121a is configured to read the process recipe from the memory 121c in accordance with an operation command inputted from the input/output device 122. According to the contents of the read process recipe, the CPU 121a may be configured to control various operations such as flow rate adjusting operations for various gases by the MFCs 241a through 241j, opening/closing operations of the valves 243a through 243j, an opening and closing operation of the APC valve 244, a pressure adjusting operation by the APC valve 244 based on the pressure sensor 245, a temperature adjusting operation of the heater 207 based on the temperature sensor 263, a start and stop of the vacuum pump 246, an operation of adjusting a rotation and a rotation speed of the boat 217 by the rotator 267 and an elevating and lowering operation of the boat 217 by the boat elevator 115.

The controller 121 is not limited to a dedicated computer. The controller 121 may be constituted by a general-purpose computer. For example, the controller 121 according to the present embodiments may be embodied by preparing an external memory 123 storing the program described above and by installing the program onto the general-purpose computer using the external memory 123. For example, the external memory 123 may include a magnetic tape, a magnetic disk such as a flexible disk and a hard disk, an optical disk such as a CD and a DVD, a magneto-optical disk such as an MO and a semiconductor memory such as a USB memory and a memory card. The means for providing the program to the computer (general-purpose computer) is not limited to the external memory 123. For example, the program may be supplied to the computer using a communication means such as the Internet and a dedicated line without using the external memory 123. The memory 121c or the external memory 123 may be embodied by a non-transitory computer readable recording medium. Hereafter, the memory 121c and the external memory 123 are collectively or individually referred to as recording medium. In the present specification, the term "recording medium" may indicate the memory 121c alone, may indicate the external memory 123 alone, or may indicate both of the memory 121c and the external memory 123.

(2) Substrate Processing

Hereinafter, as a part of the manufacturing process of the semiconductor device, an example of the substrate processing of forming a silicon oxide film (SiO film) by oxidizing a surface of the wafer 200 on which a silicon film (Si film) serving as a silicon-containing film is formed using the process furnace 202 of the substrate processing apparatus will be described. Hereinafter, operations of the components constituting the substrate processing apparatus are controlled by the controller 121. In the present specification, the term "a surface of a wafer" may refer to "a surface of a wafer itself" or may refer to "a surface of a predetermined layer or a film formed on a wafer". In the present specification, the terms "substrate" and "wafer" may be used as substantially the same meaning. That is, the term "wafer" may be substituted by "substrate" and vice versa.

A film-forming sequence according to the present embodiments will be described in detail with reference to FIG. 4. FIG. 4 is a timing diagram schematically illustrating a gas supply in the film-forming sequence according to the present embodiments.

According to the present embodiments, the film-forming sequence of the SiO film will be described by way of an example in which a first step of forming a silicon oxide layer (SiO layer) (that is, a silicon oxide layer 300b) serving as a first oxide layer by supplying the $O_2$ gas (which serves as the oxygen-containing gas) and the $H_2$ gas (which serves as the hydrogen-containing gas) to the heated wafer 200 in the process chamber 201 (which serves as the process vessel) under an atmosphere of a first pressure less than an atmospheric pressure and by oxidizing the surface of the wafer 200 on which the Si film (which serves as the silicon-containing film) is formed; and a second step of forming a silicon oxide layer (SiO layer) (that is, a silicon oxide layer 300c) serving as a second oxide layer by supplying the $O_2$ gas (which serves as the oxygen-containing gas) and the $H_2$ gas (which serves as the hydrogen-containing gas) to the heated wafer 200 in the process chamber 201 (which serves as the process vessel) under an atmosphere of a second pressure less than the atmospheric pressure and different from the first pressure and by oxidizing the surface of the wafer 200 on which the SiO layer 300b is formed are preformed. According to the present embodiments, the SiO layer 300c constitutes the SiO film formed in the film-forming sequence.

According to the present embodiments, the film-forming sequence of the SiO film will be described by way of an example in which, before the first step, an initial step of forming a silicon oxide layer (SiO layer) (that is, a silicon oxide layer 300a) serving as an initial oxide layer by supplying the $O_2$ gas (which serves as the oxygen-containing gas) to the heated wafer 200 in the process chamber 201 (which serves as the process vessel) and by oxidizing the surface of the wafer 200 on which the Si film is formed is performed.

<Wafer Charging Step and Boat Loading Step>

After the wafers 200 are transferred into the boat 217 (wafer charging step), the lower end opening of the reaction tube 203 is opened. Then, as shown in FIG. 1, the boat 217 charged with the wafers 200 is elevated by the boat elevator 115 and transferred into the process chamber 201 in which the wafers 200 are accommodated (boat loading step). With the boat 217 loaded, the seal cap 219 seals the lower end of the reaction tube 203.

<Pressure Adjusting Step and Temperature Adjusting Step>

The vacuum pump 246 vacuum-exhausts the inner atmosphere of the process chamber 201. When the vacuum pump 246 vacuum-exhausts the inner atmosphere of the process chamber 201, the inner pressure of the process chamber 201 is measured by the pressure sensor 245, and the APC valve 244 is feedback-controlled based on the measured pressure information such that the inner pressure of the process chamber 201 reaches and is maintained at a desired pressure (pressure adjusting step). The vacuum pump 246 continuously vacuum-exhausts the inner atmosphere of the process chamber 201 until at least a processing of the wafer 200 is completed. The heater 207 heats the process chamber 201 until the inner temperature of the process chamber 201 reaches and is maintained at a desired temperature. When the heater 207 heats the process chamber 201, the state of the electric conduction to the heater 207 is feedback-controlled based on the temperature information detected by the temperature sensor 263 such that a desired temperature distribution of the inner temperature of the process chamber 201 can be obtained (temperature adjusting step). Thereby, the wafer 200 is heated to the desired temperature. The heater 207 continuously heats the process chamber 201 until at least the processing of the wafer 200 is completed. Then, the rotator 267 rotates the boat 217 and the wafers 200. The rotator 267 continuously rotates the boat 217 and the wafers 200 until at least the processing of the wafer 200 is completed.

<Initial Step (Initial Oxide Layer Forming Step)>

First, as a pre-processing, the SiO layer 300a serving as the initial oxide layer is formed on the surface of the wafer 200.

The valve 243a of the first gas supply pipe 232a is opened to supply the $O_2$ gas serving as the oxygen-containing gas into the first gas supply pipe 232a. A flow rate of the $O_2$ gas supplied through the first gas supply pipe 232a is adjusted by the MFC 241a. The $O_2$ gas whose flow rate is adjusted is supplied into the process chamber 201 through the gas supply holes 250a of the first nozzle 249a, and is exhausted through the exhaust pipe 231. Thereby, the $O_2$ gas is supplied to the heated wafer 200. According to the present embodiments, a gas substantially free of hydrogen is used as the oxygen-containing gas. It is particularly preferable that the $O_2$ gas alone is supplied into the process chamber 201 as the oxygen-containing gas. That is, the oxygen-containing gas in the initial step is the $O_2$ gas free of hydrogen.

In the initial step, the valve 243f of the first inert gas supply pipe 232f may be opened to supply the inert gas such as the $N_2$ gas serving as a carrier gas of the oxygen-containing gas through the first inert gas supply pipe 232f. A flow rate of the $N_2$ gas supplied through the first inert gas supply pipe 232f is adjusted by the MFC 241f. The $N_2$ gas whose flow rate is adjusted is supplied into the first gas supply pipe 232a. The $N_2$ gas whose flow rate is adjusted is mixed with the $O_2$ gas in the first gas supply pipe 232a. The $N_2$ gas mixed with the $O_2$ gas is supplied into the process chamber 201 in a heated and decompressed state through the first nozzle 249a, and is exhausted through the exhaust pipe 231. In the initial step, in order to prevent the $O_2$ from entering the second gas supply pipe 232b through the fifth gas supply pipe 232e, the valves 243g through 243j may be opened to supply the $N_2$ gas into the second inert gas supply pipe 232g, the third inert gas supply pipe 232h, the fourth inert gas supply pipe 232i and the fifth inert gas supply pipe 232j.

In the initial step, by controlling the opening degree of the APC valve 244, for example, the inner pressure of the process chamber 201 may be set to a pressure within a range from 1 Pa to 1,330 Pa, preferably 20 Pa to 133 Pa. For example, the inner pressure of the process chamber 201 is set to 73 Pa. In the present specification, a notation of a numerical range such as "from 1 Pa to 1,330 Pa" means that a lower limit and an upper limit are included in the numerical range. Therefore, for example, the numerical range "from 1 Pa to 1,330 Pa" means a range equal to or higher than 1 Pa and equal to or lower than 1,330 Pa. The same also applies to other numerical ranges described herein. For example, a supply flow rate of the $O_2$ gas adjusted by the MFC 241a may be set to a flow rate within a range from 0.01 slm to 20.0 slm. For example, the supply flow rate of the $O_2$ gas is set to 8.7 slm. For example, a supply flow rate of the $N_2$ gas adjusted by the MFC 241f may be set to a flow rate within a range from 0.0 slm to 40.0 slm. For example, the supply flow rate of the $N_2$ gas is set to 1.0 slm. For example, a time duration of supplying the $O_2$ gas to the wafer 200 (that is, a gas supply time) may be set to a time duration within a range from 10 seconds to 600 seconds. For example, the time duration of supplying the $O_2$ gas is set to 180 seconds. In the initial step, a temperature of the heater 207 may be set such that, for example, a temperature of the wafer 200 may be within a range from 400° C. to 1,000° C. For example, the temperature of the heater 207 is set such that the temperature of the wafer 200 reaches and is maintained at 630° C.

Figure 5A:
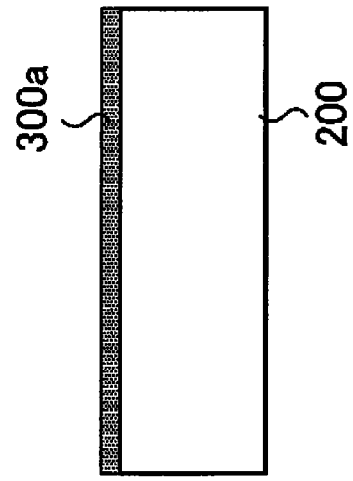
FIG. 5A is a model diagram schematically illustrating a silicon oxide layer (SiO layer) formed in an initial step.

By performing the initial step, the Si film on the wafer 200 is oxidized from the surface thereof, and as shown in FIG. 5A, for example, the SiO layer 300a serving as the initial oxide layer (which is a base oxide layer) and whose thickness is within a range from 0.1 nm to 2.0 nm is formed on the surface of the wafer 200. For example, the SiO layer 300a whose thickness is 1.0 nm is formed on the surface of the wafer 200. It is preferable that a film-forming rate (oxidation rate) of forming the initial oxide layer in the initial step is slower (lower) than a film-forming rate (oxidation rate) of forming each of the SiO layers in the first step and the second step described later. It is preferable that the film-forming rate in the initial step is 1 Å/min or less. By forming the oxide layer (that is, the initial oxide layer) at a sufficiently low oxidation rate in the initial step as describe above, it is possible to easily control a thickness distribution (particularly, a thickness uniformity on the surface of the same wafer 200) of each of the SiO layers in the first step and the second step to be performed later.

<First Step (First Oxide Layer Forming Step)>

Subsequently, the SiO layer 300b serving as the first oxide layer is formed on the surface of the wafer 200 on which the initial oxide layer (that is, the SiO layer 300a) is formed by the initial step.

<Low Pressure Oxidation Process>

While the $O_2$ gas and the $N_2$ gas are continuously supplied through the first nozzle 249a, the controller 121 controls the APC valve 244 such that the inner pressure of the process chamber 201 reaches and is maintained at a predetermined pressure less than the atmospheric pressure (101.3 kPa). In the low pressure oxidation process, the valve 243b of the second gas supply pipe 232b is opened to supply the $H_2$ gas serving as the hydrogen-containing gas into the second gas supply pipe 232b. A flow rate of the $H_2$ gas supplied through the second gas supply pipe 232b is adjusted by the MFC 241b. The $H_2$ gas whose flow rate is adjusted is supplied into the process chamber 201 through the gas supply holes 250b of the second nozzle 249b, and is exhausted through the exhaust pipe 231. In the low pressure oxidation process, the $O_2$ gas serving as the oxygen-containing gas, the $H_2$ gas and the $N_2$ gas serving as the carrier gas are supplied from an outer periphery of the heated wafer 200 toward a center of the heated wafer 200. In the low pressure oxidation process, a concentration ratio of the $O_2$ gas and the $H_2$ gas in the process chamber 201 (that is, a flow rate ratio of the $O_2$ gas and the $H_2$ gas supplied into the process chamber 201) is set (adjusted) to a predetermined concentration ratio within a range from 80:20 to 35:65.

According to the present embodiments, in the low pressure oxidation process, the valve 243g of the second inert gas supply pipe 232g may be opened to supply the inert gas such as the $N_2$ gas serving as a carrier gas of the $H_2$ gas through the second inert gas supply pipe 232g. A flow rate of the $N_2$ gas supplied through the second inert gas supply pipe 232g is adjusted by the MFC 241g. The $N_2$ gas whose flow rate is adjusted is supplied into the second gas supply pipe 232b. The $N_2$ gas whose flow rate is adjusted is mixed with the $H_2$ gas in the second gas supply pipe 232b. The $N_2$ gas mixed with the $H_2$ gas is supplied to the wafer 200 from the outer periphery thereof toward the center thereof through the second nozzle 249b.

<Assist $H_2$ Gas Supply Step>

According to the present embodiments, in the low pressure oxidation process, the $H_2$ gas is supplied through the third gas supply pipe 232c, the fourth gas supply pipe 232d and the fifth gas supply pipe 232e (the $H_2$ gas supplied through the third gas supply pipe 232c, the fourth gas supply pipe 232d and the fifth gas supply pipe 232e may also be referred to as "assist $H_2$ gas"). The assist $H_2$ gas is supplied to the wafer 200 from the outer periphery thereof toward the center thereof through the first assist nozzle 249c, the second assist nozzle 249d and the third assist nozzle 249e.

In the assist $H_2$ gas supply step, the assist $H_2$ gas may be used to appropriately adjust a film-forming distribution of the SiO layer formed on the surface of the wafer 200 in the first step and the second step described later. For example, a flow rate of the assist $H_2$ gas may be adjusted. Specifically, by adjusting the flow rate of the assist $H_2$ gas supplied through the first assist nozzle 249c, the second assist nozzle 249d and the third assist nozzle 249e, it is possible to finely adjust a distribution of a concentration of the $H_2$ gas (in particular, a concentration ratio of the $H_2$ gas with the $O_2$ gas) in a direction parallel to the surface of the wafer 200 (that is, the horizontal direction). Further, since the positions of the gas supply holes 250c through 250e provided in each assist nozzle in the height direction are different from one another, by adjusting the flow rate of the assist $H_2$ gas supplied through each assist nozzle, it is possible to finely adjust the distribution of the concentration of the $H_2$ gas (in particular, the concentration ratio of the $H_2$ gas with the $O_2$ gas) in the direction in which the wafers 200 are arranged (that is, the vertical direction).

As described above, by finely adjusting the distribution of the concentration of the $H_2$ gas (in particular, the concentration ratio of the $H_2$ gas with the $O_2$ gas), it is possible to adjust an oxidation rate distribution (the film-forming distribution of the SiO layer) on the surface of the wafer 200 and between the wafers 200 to be closer to a desired distribution.

<Assist $N_2$ Gas Supply Step>

In the low pressure oxidation process, the valves 243h, 243i and 243j may be opened to supply the $N_2$ gas serving the inert gas through the third gas supply pipe 232c, the fourth gas supply pipe 232d and the fifth gas supply pipe 232e (the $N_2$ gas supplied through the third gas supply pipe 232c, the fourth gas supply pipe 232d and the fifth gas supply pipe 232e may also be referred to as "assist $N_2$ gas"). The assist $N_2$ gas is mixed with the $H_2$ gas in each of the third gas supply pipe 232c, the fourth gas supply pipe 232d and the fifth gas supply pipe 232e. The $N_2$ gas mixed with the $H_2$ gas is supplied to the wafer 200 accommodated in the process chamber 201 from the outer periphery of the wafer 200 toward the center of the wafer 200 through the first assist nozzle 249c, the second assist nozzle 249d and the third assist nozzle 249e.

In the first step, by controlling the opening degree of the APC valve 244, for example, the inner pressure of the process chamber 201 is set to the first pressure (which is less than the atmospheric pressure) within a range from 1 Pa to 665 Pa. For example, the first pressure is 532 Pa. For example, the supply flow rate of the $O_2$ gas adjusted by the MFC 241a may be set to a flow rate within a range from 0.1 slm to 20.0 slm. For example, the supply flow rate of the $O_2$ gas is set to 10.0 slm. For example, the supply flow rate of the $N_2$ gas adjusted by the MFC 241f may be set to a flow rate within a range from 0.0 slm to 40.0 slm. For example, the supply flow rate of the $N_2$ gas adjusted by the MFC 241f is set to 19.0 slm. For example, the supply flow rate of the $H_2$ gas adjusted by the MFC 241b may be set to a flow rate within a range from 0.1 slm to 10.0 slm. For example, the supply flow rate of the $H_2$ gas adjusted by the MFC 241b is set to 3.0 slm. For example, the supply flow rate of the $N_2$ gas adjusted by the MFC 241g may be set to a flow rate within a range from 0.0 slm to 40.0 slm. For example, the supply flow rate of the $N_2$ gas adjusted by the MFC 241g is set to 1.5 slm. For example, a time duration of supplying the $H_2$ gas and the $O_2$ gas to the wafer 200 (that is, a gas supply time) may be set to a time duration within a range from 0.1 minutes to 300 minutes. For example, the time duration of supplying the $H_2$ gas and the $O_2$ gas is set to 28.25 minutes. In the first step, the temperature of the heater 207 may be set such that, for example, the temperature of the wafer 200 may be within a range from 400° C. to 1,000° C. For example, the temperature of the heater 207 is set such that the temperature of the wafer 200 reaches and is maintained at 630° C. For example, the supply flow rate of the $H_2$ gas adjusted by each of the MFCs 241c through 241e may be set to a flow rate within a range from 0.0 slm to 10.0 slm. For example, the supply flow rate of the $H_2$ gas adjusted by each of the MFCs 241c through 241e is set to 0.3 slm. For example, the supply flow rate of the $N_2$ gas adjusted by each of the MFCs 241h through 241*j* may be set to a flow rate within a range from 0.0 slm to 40.0 slm. For example, the supply flow rate of the $N_2$ gas adjusted by each of the MFCs 241*h* through 241*j* is set to 3.0 slm.

In the first step, by supplying the $O_2$ gas and the $H_2$ gas into the process chamber 201 according to the above-described processing conditions, the $O_2$ gas and the $H_2$ gas are thermally activated under a non-plasma state and react with each other. Thereby, an oxidizing species containing oxygen such as atomic oxygen (O) and free of water vapor ($H_2O$) is generated. Then, by oxidizing the surface of the wafer 200 on which the initial oxide layer (that is, the SiO layer 300*a*) is formed mainly by the oxidizing species, the SiO layer 300*b* serving as the first oxide layer is formed. According to the present embodiments, the SiO layer 300*b* serving as the first oxide layer refers to the SiO layer formed on the surface of the wafer 200 by performing the first step. Therefore, according to the present embodiments, the SiO layer 300*b* includes the oxide layer (that is, the SiO layer 300*a*) formed by performing the initial oxide layer forming step. Further, when the initial oxide layer forming step is omitted and the first step alone is performed, the oxide layer formed by the first step alone may be referred to as the first oxide layer.

According to the present embodiments, the inner pressure of the process chamber 201 (that is, the first pressure) in the first step is adjusted to be different from the inner pressure of the process chamber 201 (that is, the second pressure) in the second step. By setting a process pressure in the first step as described above, it is possible to set a deviation of the oxidation rate distribution in a radial direction between an outer peripheral portion (in the vicinity of the outer periphery) of the wafer 200 and a central portion of the wafer 200 in the first step different from that in the second step.

According to the present embodiments, the first pressure in the first step is adjusted to be lower than the second pressure. By setting the process pressure in the first step as described above, the gas may easily reach the center of the wafer 200 as compared with the second step, and an oxidation reaction may be likely to occur at the center of the wafer 200. Therefore, the oxidation rate in the central portion of the wafer 200 on the surface of the wafer 200 in the first step is higher than that in the second step, and the oxidation rate in the outer peripheral portion of the wafer 200 on the surface of the wafer 200 in the first step is lower than that in the second step.

Figure 5B:
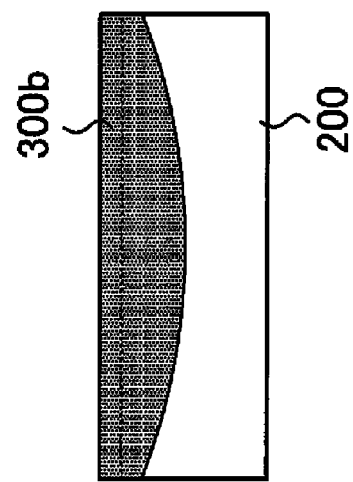
FIG. 5B is a model diagram schematically illustrating a silicon oxide layer formed in a first step.

According to the present embodiments, the first pressure in the first step is adjusted (set) such that the oxidation rate increases from the outer peripheral portion toward the central portion in the radial direction of the wafer 200 (that is, the deviation of the oxidation rate distribution occurs in a convex shape in the radial direction). As a result, as shown in FIG. 5B, the SiO layer 300*b* is formed such that the thickness of the SiO layer 300*b* in the central portion of the wafer 200 is greater than the thickness of the SiO layer 300*b* in the outer peripheral portion of the wafer 200, and the thickness distribution is of a convex shape on the surface of the wafer 200.

<Second Step (Second Oxide Layer Forming Step)>

Subsequently, the SiO layer 300*c* serving as the second oxide layer is formed on the surface of the wafer 200 on which the first oxide layer (that is, the SiO layer 300*b*) is formed by the first step.

<High Pressure Oxidation Process>

While the $O_2$ gas and the $N_2$ gas are continuously supplied through the first nozzle 249*a*, the $H_2$ gas and the $N_2$ gas are continuously supplied through the second nozzle 249*b* and the $H_2$ gas and the $N_2$ gas through the first assist nozzle 249*c*, the second assist nozzle 249*d* and the third assist nozzle 249*e*, the controller 121 controls the APC valve 244 such that the inner pressure of the process chamber 201 reaches and is maintained at a predetermined pressure less than the atmospheric pressure and greater that the first pressure. Similar to the first step, in the high pressure oxidation process, the $O_2$ gas, the $H_2$ gas and the $N_2$ gas are supplied from the outer periphery of the wafer 200 toward the center of the wafer 200. In the high pressure oxidation process, the concentration ratio of the $O_2$ gas and the $H_2$ gas in the process chamber 201 is set (adjusted) to a predetermined concentration ratio within a range from 80:20 to 35:65. Similar to the first step, in the high pressure oxidation process, each of the assist $H_2$ gas and the assist $N_2$ gas may be used to appropriately adjust the film-forming distribution of the SiO layer formed on the surface of the wafer 200.

In the second step, by controlling the opening degree of the APC valve 244, for example, the inner pressure of the process chamber 201 is set to the second pressure (which is less than the atmospheric pressure and different from the first pressure) within a range from 399 Pa to 13,300 Pa. For example, the second pressure is 665 Pa. For example, the supply flow rate of the $O_2$ gas adjusted by the MFC 241*a* may be set to a flow rate within a range from 0.1 slm to 20.0 slm. For example, the supply flow rate of the $O_2$ gas is set to 10.0 slm. For example, the supply flow rate of the $N_2$ gas adjusted by the MFC 241*f* may be set to a flow rate within a range from 0.0 slm to 40.0 slm. For example, the supply flow rate of the $N_2$ gas adjusted by the MFC 241*f* is set to 3.0 slm. That is, the supply flow rate of the $N_2$ gas adjusted by the MFC 241*f* is changed from the supply flow rate of the $N_2$ gas adjusted by the MFC 241*f* in the first step. Specifically, the supply flow rate of the $N_2$ gas adjusted by the MFC 241*f* is set to be smaller than the supply flow rate of the $N_2$ gas adjusted by the MFC 241*f* in the first step. For example, the supply flow rate of the $H_2$ gas adjusted by the MFC 241*b* may be set to a flow rate within a range from 0.1 slm to 10.0 slm. For example, the supply flow rate of the $H_2$ gas adjusted by the MFC 241*b* is set to 3.0 slm. For example, the supply flow rate of the $N_2$ gas adjusted by the MFC 241*g* may be set to a flow rate within a range from 0.1 slm to 40.0 slm. For example, the supply flow rate of the $N_2$ gas adjusted by the MFC 241*g* is set to 1.5 slm. For example, a time duration of supplying the $H_2$ gas and the $O_2$ gas to the wafer 200 (that is, a gas supply time) may be set to a time duration within a range from 0.1 minute to 300 minutes. For example, the time duration of supplying the $H_2$ gas and the $O_2$ gas is set to 11.75 minutes. In the second step, the temperature of the heater 207 may be set such that, for example, the temperature of the wafer 200 may be within a range from 400° C. to 1,000° C. For example, the temperature of the heater 207 is set such that the temperature of the wafer 200 reaches and is maintained at 630° C. For example, the supply flow rate of the $H_2$ gas adjusted by each of the MFCs 241*c* through 241*e* may be set to a flow rate within a range from 0.1 slm to 10.0 slm. For example, the supply flow rate of the $H_2$ gas adjusted by each of the MFCs 241*c* through 241*e* is set to 0.3 slm. For example, the supply flow rate of the $N_2$ gas adjusted by each of the MFCs 241*h* through 241*j* may be set to a flow rate within a range from 0.1 slm to 40.0 slm. For example, the supply flow rate of the $N_2$ gas adjusted by each of the MFCs 241*h* through 241*j* is set to 3.0 slm.

In the second step, by supplying the $O_2$ gas and the $H_2$ gas into the process chamber 201 according to the above-described processing conditions, the $O_2$ gas and the $H_2$ gas are thermally activated under the non-plasma state and react with each other. Then, by oxidizing the surface of the wafer 200 on which the SiO layer 300b is formed mainly by the oxidizing species, the SiO layer 300c (which serves as the second oxide layer) formed so as to increase the thickness of the SiO layer 300b is formed.

According to the present embodiments, in the second step, as described above, the second pressure is adjusted to be different from the first pressure. By setting a process pressure in the second step different from that in the first step as described above, it is possible to adjust a probability (of being easy or hard to reach) that the oxidizing gas such as the $O_2$ gas reaches the central portion from the outer periphery of the wafer 200 for each of the first step and the second step. That is, by setting the process pressure different for each of the first step and the second step, it is possible to set the deviation of the oxidation rate distribution in the radial direction between the outer peripheral portion of the wafer 200 and the central portion of the wafer 200 in the second step different from that in the first step.

According to the present embodiments, the second pressure in the second step is adjusted to be higher than the first pressure. By setting the process pressure in the second step as described above, the gas may be less likely to reach the center of the wafer 200 as compared with the first step, and the oxidation reaction may be likely to occur at the outer peripheral portion of the wafer 200 (which is an upstream side in reference to a direction of a gas flow). Therefore, the oxidation rate in the central portion of the wafer 200 on the surface of the wafer 200 in the second step can be set to be lower than that in the first step, and the oxidation rate in the outer peripheral portion of the wafer 200 on the surface of the wafer 200 in the second step can be set to be higher than that in the first step.

As described above, by performing the first step and the second step whose oxidation rate distributions in the radial direction of the wafer 200 are different, it is possible to adjust a thickness distribution of the SiO layer 300c in the radial direction of the wafer 200 to be closer to a desired distribution. That is, it is possible to improve a controllability of the thickness distribution of the SiO layer 300c on the surface of the wafer 200.

According to the present embodiments, the second pressure in the second step is adjusted (set) such that the oxidation rate decreases from the outer peripheral portion toward the central portion in the radial direction of the wafer 200 (that is, the deviation of the oxidation rate distribution occurs in a concave shape in the radial direction). When the second step alone is performed without performing the first step, the SiO layer 300c is formed by the second step such that the thickness of the SiO layer 300c in the outer peripheral portion of the wafer 200 is greater than the thickness of the SiO layer 300c in the central portion of the wafer 200, and the thickness distribution is of a concave shape on the surface of the wafer 200.

Figure 5C:
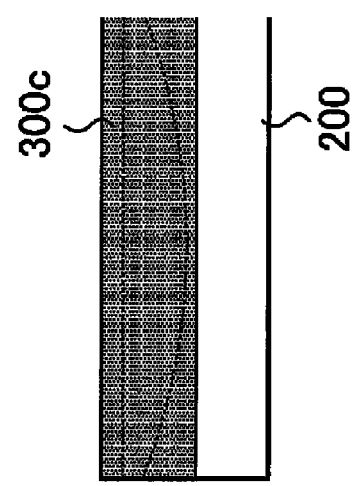
FIG. 5C is a model diagram schematically illustrating a silicon oxide layer formed in a second step.

According to the present embodiments, in the first step, the SiO layer 300b is formed such that the thickness distribution on the surface of the wafer 200 is of a convex shape. Therefore, by performing the second step, it is possible to adjust the thickness distribution of the SiO layer 300c on the surface of the wafer 200 to be closer to a uniform distribution as shown in FIG. 5C. That is, by performing a combination of the first step in which the oxidation rate in the central portion of the wafer 200 is higher than that in the outer peripheral portion of the wafer 200 and the second step in which the oxidation rate in the outer peripheral portion of the wafer 200 is higher than that in the central portion of the wafer 200, it is possible to compensate the non-uniform distribution of the oxidation rate in the first step by the non-uniform distribution of the oxidation rate in the second step. As a result, it is possible to form the SiO layer 300c whose thickness uniformity on the surface of the wafer 200 is excellent.

In addition, by decreasing the supply flow rate of the $N_2$ gas supplied through the first nozzle 249a and the second nozzle 249b in the second step as compared with the first step, it is possible to set the oxidation rate of forming the SiO layer 300c such that the oxidation rate in the central portion of the wafer 200 is further lower than that in the outer peripheral portion of the wafer 200. That is, in the second step, by decreasing the supply flow rate of the $N_2$ gas serving as the carrier gas, it is possible to adjust the oxidation rate such that the oxidation rate distribution of the concave shape in the radial direction of the wafer 200 is further strengthened.

In addition, by increasing the supply flow rate of the $N_2$ gas supplied through the first nozzle 249a and the second nozzle 249b in the first step, it is possible to set the oxidation rate of forming the SiO layer 300b such that the oxidation rate in the central portion of the wafer 200 is further higher than that in the outer peripheral portion of the wafer 200. That is, in the first step, by increasing the supply flow rate of the $N_2$ gas serving as the carrier gas, it is possible to adjust the oxidation rate of forming the SiO layer 300b such that the oxidation rate distribution of the convex shape in the radial direction of the wafer 200 is further strengthened.

Then, the valve 243a of the first gas supply pipe 232a, the valve 243b of the second gas supply pipe 232b and the valves 243c, 243d and 243e of the third gas supply pipe 232c, the fourth gas supply pipe 232d and the fifth gas supply pipe 232e are closed to stop the supply of the $O_2$ gas and the supply of the $H_2$ gas. When stopping the supply of the $O_2$ gas and the supply of the $H_2$ gas, with the APC valve 244 open, the vacuum pump 246 vacuum-exhausts the inner atmosphere of the process chamber 201 to remove the $O_2$ gas and the $H_2$ gas which did not react or which contributed to the formation of the SiO layer from the process chamber 201 (residual gas removing step).

<Purge Step and Returning to Atmospheric Pressure Step>

With the valves 243f through 243j open, the $N_2$ gas serving as the inert gas is supplied into the process chamber 201 through each of the first inert gas supply pipe 232f, the second inert gas supply pipe 232g, the third inert gas supply pipe 232h, the fourth inert gas supply pipe 232i and the fifth inert gas supply pipe 232j, and is exhausted through the exhaust pipe 231. The $N_2$ gas serves as the purge gas, and the $O_2$ gas and the $H_2$ gas remaining in the process chamber 201 are removed from the process chamber 201 (purge step). Thereafter, the inner atmosphere of the process chamber 201 is replaced with the inert gas, and the inner pressure of the process chamber 201 is returned to the normal pressure (atmospheric pressure) (returning to the atmospheric pressure step).

<Boat Unloading Step and Wafer Discharging Step>

Thereafter, by lowering the boat 217 by the boat elevator 115, the processed wafers 200 supported by the boat 217 are unloaded out of the reaction tube 203 through the lower end of the reaction tube 203 (boat unloading step). Then, the processed wafers 200 are transferred (discharged) from the boat 217 (wafer discharging step).

(3) Relationship Between Process Time and Oxidation Rate

Figure 6:
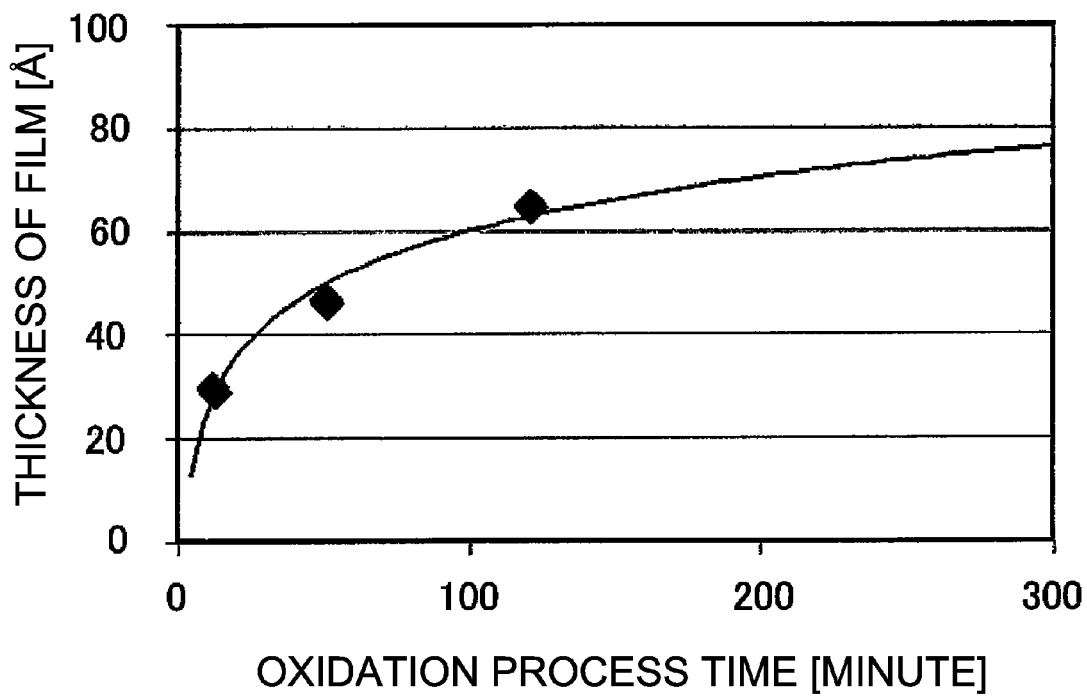
FIG. 6 is a diagram schematically illustrating a relationship between an oxidation process time of $H_2$ gas and $O_2$ gas and a thickness of a film formed by an oxidation process.

Subsequently, the oxidation rate when the SiO film is formed on the surface of the wafer by using the $H_2$ gas and the $O_2$ gas as in the first step and the second step will be described. FIG. 6 is a diagram schematically illustrating a relationship between an oxidation process time of $H_2$ gas and $O_2$ by supplying the $H_2$ gas and the $O_2$ gas and a thickness of the SiO film formed on the surface of the wafer when the SiO film is formed using the $H_2$ gas and the $O_2$ gas at the temperature of the wafer of 600° C.

As shown in FIG. 6, when the SiO film is formed on the surface of the wafer using the $H_2$ gas and the $O_2$ gas, it is confirmed that the oxidation rate is particularly high immediately after the $H_2$ gas and the $O_2$ gas are supplied. That is, in an initial stage immediately after the $H_2$ gas and the $O_2$ gas are supplied, the oxidation rate is high and the SiO film is rapidly formed in a short time. Thus, it may be difficult to control the film-forming distribution on the surface of the wafer and the film-forming distribution between the wafers. Therefore, as in the initial step of the present embodiments, by forming the initial oxide layer whose thickness uniformity on the surface of the wafer is high in advance by performing the oxidation process whose oxidation rate is low using the $O_2$ gas in the initial stage of forming the SiO film, it is possible to avoid the occurrence of the extreme deviation of the oxidation rate distribution that occurs remarkably in initial stages of the first step and the second step to be performed later, and it is also possible to improve the controllability of the thickness distribution of the SiO layer (in particular, the thickness uniformity on the surface of the wafer).

Figure 7:
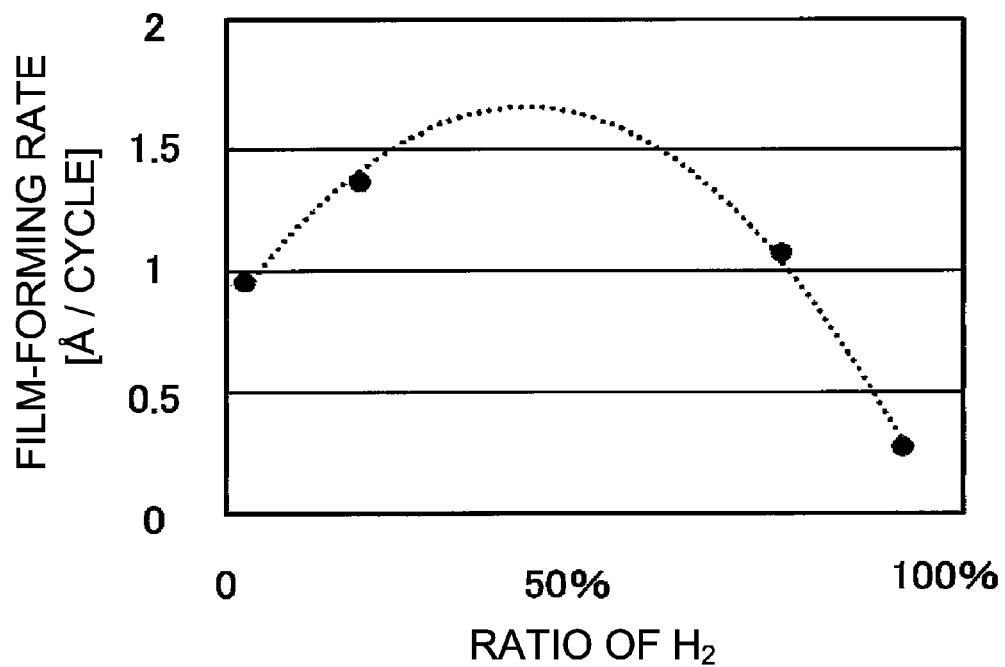
FIG. 7 is a diagram schematically illustrating a relationship between a ratio of the $H_2$ gas in a mixed gas of the $H_2$ gas and the $O_2$ gas and a film-forming rate.

(4) Relationship Between Concentration Ratio of $H_2$ Gas and Oxidation Rate Subsequently, a relationship between the ratio of the $H_2$ gas in the $H_2$ gas and the $O_2$ gas and the film-forming rate (oxidation rate) will be described. FIG. 7 schematically illustrates results of an experiment that the film-forming rate of the SiO film is obtained (under a plurality of conditions in which the ratio of the $H_2$ gas in the $H_2$ gas and the $O_2$ gas is different) by forming the SiO film by repeatedly and alternately performing a step of supplying hexachlorodisilane gas ($Si_2Cl_6$ gas) serving as a silicon (Si) source gas to the surface of the wafer and a step of performing the oxidation process using the $H_2$ gas and the $O_2$ gas. That is, in FIG. 7, the higher the film-forming rate, the higher the oxidation rate. Concentrations of the $H_2$ gas at plot points in FIG. 7 indicate 2.0%, 18.4%, 80.0% and 97.4%, respectively.

As shown in FIG. 7, it is possible to control the film-forming rate of the SiO film formed on the surface of the wafer by changing the ratio (concentration ratio) of the flow rate of the $H_2$ gas to a total flow rate of the $H_2$ gas and the $O_2$ gas. Specifically, it is possible to increase the oxidation rate by setting the concentration ratio of the $O_2$ gas to the $H_2$ gas to a predetermined value within a range from 80:20 to 35:65. In addition, it is possible to decrease the oxidation rate by setting the concentration ratio of the $O_2$ gas to the $H_2$ gas to a predetermined value other than the range from 80:20 to 35:65.

(5) Pressure Dependence of Thickness Distribution of Film

Figure 8:
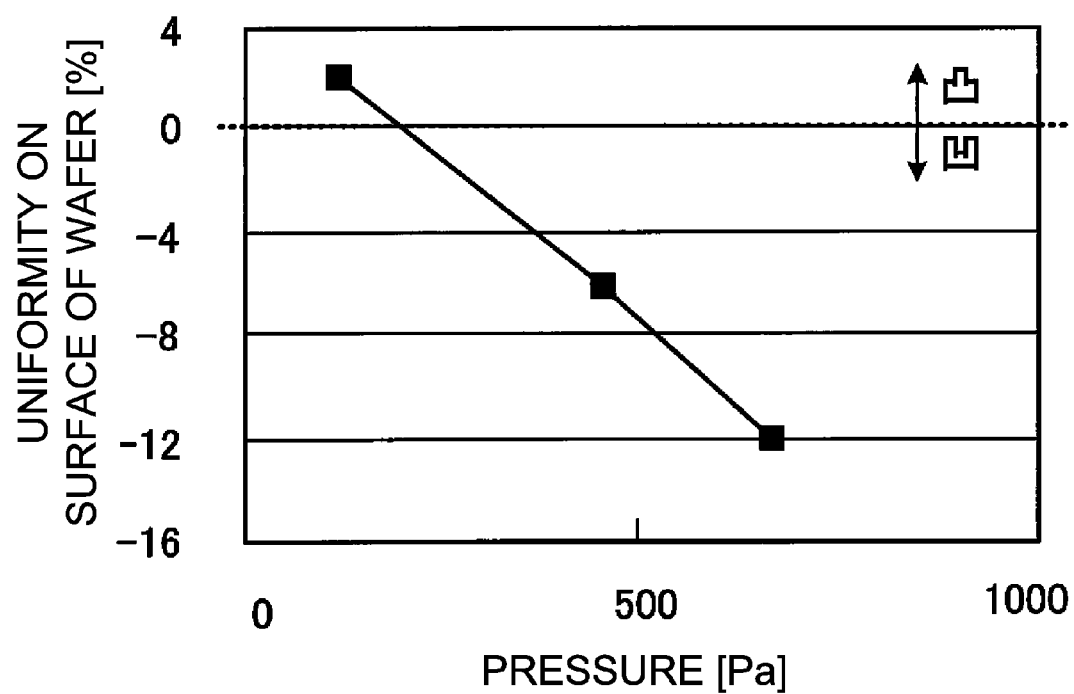
FIG. 8 is a diagram schematically illustrating a pressure dependence of a uniformity on a surface of a wafer.

Subsequently, a pressure dependence of the thickness distribution of the SiO film will be described. FIG. 8 is a diagram schematically illustrating a relationship between the inner pressure of the process chamber 201 and the thickness uniformity on the surface of the wafer when the concentration ratio of the $O_2$ gas and the $H_2$ gas is 33%. In FIG. 8, "0" on a vertical axis indicates that the SiO film of a flat shape is formed on the surface of the wafer, values (positive values) greater than 0 on the vertical axis indicates that the SiO film of a convex shape is formed on the surface of the wafer, and values (negative values) smaller than 0 on the vertical axis indicates that the SiO film of a concave shape is formed on the surface of the wafer. As the wafer, a bare wafer with no pattern formed on the surface thereof is used.

As shown in FIG. 8, when the process conditions other than the pressure are the same, it is confirmed that, as the inner pressure of the process chamber 201 increases, the tendency for a concave film to be formed on the surface of the wafer becomes stronger. It is presumed that such a phenomenon occurs because a probability of the gas reaching the center of the wafer increases in a low pressure condition by decreasing the number of molecules in the process chamber 201 and increasing a mean free path length of the gas, and the probability of the gas reaching the center of the wafer decreases in a high pressure condition by increasing the number of the molecules in the process chamber 201 and decreasing the mean free path length of the gas.

(6) Other Embodiments

While the embodiments described above are described by way of an example in which the first step and the second step are performed in the order described above, the technique of the present disclosure is not limited thereto. For example, the second step may be performed first to form the SiO layer of a concave shape on the surface of the wafer 200, and then the first step may be performed to adjust the thickness distribution on the surface of the wafer 200 so as to compensate for the thickness distribution of a concave shape.

While the embodiments described above are described by way of an example in which the $O_2$ gas is used in the initial step, the technique of the present disclosure is not limited thereto. For example, the initial oxide layer may be formed by using the $O_2$ gas and the $H_2$ gas in the initial step. In such a case, the concentration ratio of the $O_2$ gas and the $H_2$ gas in the process chamber 201 is set to a predetermined value other than the range from 80:20 to 35:65. That is, the concentration ratio of the $O_2$ gas and the $H_2$ gas in the process chamber 201 is set to a ratio within a region of a low oxidation rate, preferably a region of the oxidation rate of 1 Å/min or less.

While the embodiments described above are described by way of the example in which the $O_2$ gas is used in the initial step, the technique of the present disclosure is not limited thereto. Preferably, a film-forming gas whose oxidation rate is within a region of 1 Å/min or less may be used. For example, when the film-forming gas such as ozone ($O_3$) is used, it is possible to decrease the oxidation rate, and it is also possible to obtain the effects described above in the same manner.

While the embodiments described above are described by way of an example in which the SiO layer is formed on the surface of the wafer on which the silicon-containing film is formed, the technique of the present disclosure is not limited thereto. For example, the above-described technique may also be applied when an oxide layer is formed on a surface of a wafer on which a metal-containing film is formed.

While the embodiments described above are described by way of an example in which the $O_2$ gas and the $H_2$ gas are separately supplied through the first nozzle 249a and the second nozzle 249b, respectively, the technique of the present disclosure is not limited thereto. For example, a mixed gas of the $O_2$ gas and the $H_2$ gas may be supplied through the same nozzle.

While the embodiments described above are described by way of an example in which the $O_2$ gas is used as the oxygen-containing gas in the initial step, the first step and the second step, the technique of the present disclosure is not limited thereto. For example, a gas such as the $O_3$ gas and nitrogen monoxide (NO) gas may be used as the oxygen-containing gas, or different oxygen-containing gases may be used in each step. For example, a first oxygen-containing gas may be used in the first step and a second oxygen-containing gas may be used in the second step.

While the technique of the present disclosure is described in detail by way of the embodiments described above, the technique of the present disclosure is not limited thereto. The technique of the present disclosure may be modified in various ways without departing from the gist thereof. For example, the embodiments described above may be appropriately combined.

(7) Example

As an example of the technique of the present disclosure, a silicon oxide film (SiO film) is formed on a surface of a wafer by the substrate processing shown in FIG. 4 and by using the substrate processing apparatus shown in FIG. 1. As the wafer, a bare wafer with no pattern formed on the surface thereof is used. In the substrate processing of forming the SiO film of the example, the gas supply time of the $O_2$ gas in the initial step is set to 3 minutes, the gas supply time of the $H_2$ gas and the $O_2$ gas in the first step is set to 27 minutes, and the gas supply time of the $H_2$ gas and $O_2$ gas in the second step is set to 13 minutes. The process conditions in each step other than the gas supply times described above are set to predetermined conditions within the range of the process conditions described in the above-described embodiments.

As a comparative example, a silicon oxide film (SiO film) is formed on a surface of a wafer by the substrate processing shown in FIG. 4 and by using the first step alone the substrate processing apparatus shown in FIG. 1. As the wafer, similar to the example of the technique of the present disclosure, a bare wafer with no pattern formed on the surface thereof is used. The gas supply time of the $H_2$ gas and the $O_2$ gas in the first step is set to 40 minutes. The process conditions other than the gas supply time described above are set to predetermined conditions within the range of the process conditions described in the above-described embodiments.

Figure 9A:
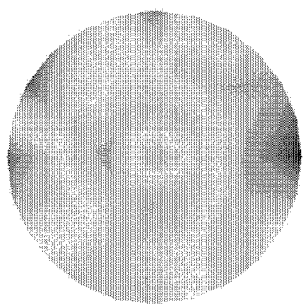
FIG. 9A is a diagram schematically illustrating a thickness distribution of a silicon oxide layer (SiO layer) formed on a surface of a wafer placed on an upper region of a boat according to an example of the embodiments.
Figure 9D:
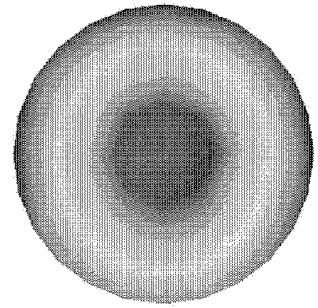
FIG. 9D is a diagram schematically illustrating a thickness distribution of a silicon oxide layer formed on the surface of the wafer placed on the upper region of the boat according to a comparative example.
Figure 9B:
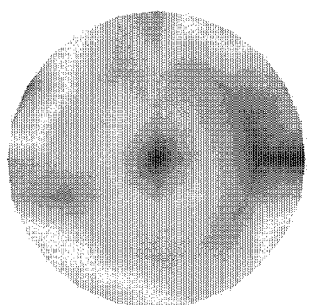
FIG. 9B is a diagram schematically illustrating a thickness distribution of a silicon oxide layer formed on a surface of a wafer placed on a central region of the boat according to the example of the embodiments.
Figure 9E:
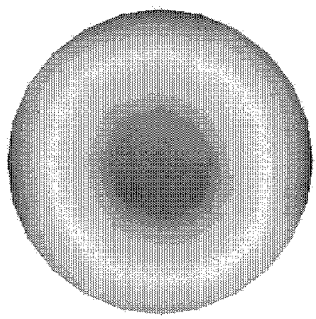
FIG. 9E is a diagram schematically illustrating a thickness distribution of a silicon oxide layer formed on the surface of the wafer placed on the central region of the boat according to the comparative example.
Figure 9C:
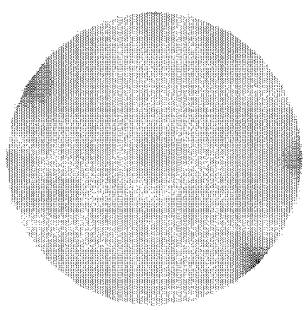
FIG. 9C is a diagram schematically illustrating a thickness distribution of a silicon oxide layer formed on a surface of a wafer placed on a lower region of the boat according to an example of the embodiments.
Figure 9F:
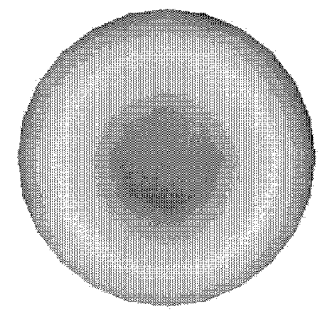
FIG. 9F is a diagram schematically illustrating a thickness distribution of a silicon oxide layer formed on the surface of the wafer placed on the lower region of the boat according to the comparative example.

According to the comparative example, as shown in FIG. 9D, the thickness uniformity of the SiO film formed on the surface of the wafer arranged in the upper region of the boat 217 is +4.62%, as shown in FIG. 9E, the thickness uniformity of the SiO film formed on the surface of the wafer arranged in the central region of the boat 217 is +3.64%, and as shown in FIG. 9F, the thickness uniformity of the SiO film formed on the surface of the wafer arranged in the lower region of the boat 217 is +6.0%. That is, the SiO film is formed in a convex shape on the surfaces of the wafers arranged from the lower region to the upper region of the boat 217.

On the other hand, according to the example of the technique of the present disclosure, as shown in FIG. 9A, the thickness uniformity of the SiO film formed on the surface of the wafer arranged in the upper region of the boat 217 is +1.02%, as shown in FIG. 9B, the thickness uniformity of the SiO film formed on the surface of the wafer arranged in the central region of the boat 217 is −0.98%, and as shown in FIG. 9C, the thickness uniformity of the SiO film formed on the surface of the wafer arranged in the lower region of the boat 217 is −1.70%. That is, the thickness uniformity of the SiO film formed on the surfaces of the wafers arranged from the lower region to the upper region of the boat 217 is improved as compared with the comparative example.

From the results described above, it is confirmed that the thickness uniformity of the oxide film formed on the surface of the wafer is improved by performing the substrate processing according to the present embodiments.

As described above, according to some embodiments in the present disclosure, it is possible to improve the controllability of the thickness distribution of the oxide film formed on the surface of the substrate.

What is claimed is:

1. A substrate processing method, comprising:
   (a) forming a first oxide layer by supplying an oxygen-containing gas and an hydrogen-containing gas to a heated substrate at a first pressure less than an atmospheric pressure and by oxidizing a surface of the substrate to transform a first surface portion of the substrate into the first oxide layer; and
   (b) forming a second oxide layer by supplying the oxygen-containing gas and the hydrogen-containing gas to the heated substrate at a second pressure less than the atmospheric pressure and different from the first pressure and by oxidizing the surface of the substrate to transform a second surface portion of the substrate into the second oxide layer, wherein the second surface portion is partly constituted by the first oxide layer formed in (a),
   wherein the oxygen-containing gas and the hydrogen-containing gas are supplied from an outer periphery of the substrate toward a center of the substrate in (a) and (b).

2. The method of claim 1, wherein the surface of the substrate is oxidized in (a) and (b) while rotating the substrate.

3. The method of claim 2, wherein the first pressure is lower than the second pressure, and
   the first pressure is set in (a) such that an oxidation rate of oxidizing the surface of the substrate at the center of the substrate is greater than that of oxidizing the surface of the substrate in vicinity of the outer periphery of the substrate.

4. The method of claim 3, wherein the second pressure is set in (b) such that an oxidation rate of oxidizing the surface of the substrate on which the first oxide layer is formed at the center of the substrate is less than that of oxidizing the surface of the substrate on which the first oxide layer is formed in the vicinity of the outer periphery of the substrate.

5. The method of claim 2, wherein the first pressure is higher than the second pressure, and
   the first pressure is set in (a) such that an oxidation rate of oxidizing the surface of the substrate at the center of the substrate is less than that of oxidizing the surface of the substrate in vicinity of the outer periphery of the substrate.

6. The method of claim 5, wherein the second pressure is set in (b) such that an oxidation rate of oxidizing the surface of the substrate on which the first oxide layer is formed at the center of the substrate is greater than that of oxidizing the surface of the substrate on which the first oxide layer is formed in the vicinity of the outer periphery of the substrate.

7. The method of claim 1, further comprising
   (c) forming an initial oxide layer by supplying a second oxygen-containing gas to the substrate and by oxidizing the surface of the substrate before (a).

8. The method of claim 7, wherein a rate of forming the initial oxide layer in (c) is less than a rate of forming the first oxide layer in (a).

9. The method of claim 7, wherein the second oxygen-containing gas supplied in (c) comprises oxygen gas free of hydrogen.

10. A substrate processing method, comprising:
    (a) forming a first oxide layer by supplying an oxygen-containing gas and a hydrogen-containing gas to a heated substrate at a first pressure less than an atmospheric pressure and by oxidizing a surface of the substrate to transform a first surface portion of the substrate into the first oxide layer;
    (b) forming a second oxide layer by supplying the oxygen-containing gas and the hydrogen-containing gas to the heated substrate at a second pressure less than the atmospheric pressure and different from the first pressure and by oxidizing the surface of the substrate to transform a second surface portion of the substrate into the second oxide layer, wherein the second surface portion is partly constituted by the first oxide layer formed in (a); and
    (c) supplying an inert gas to the substrate through an inert gas nozzle different from one or more gas nozzles through which the oxygen-containing gas and the hydrogen-containing gas are supplied to the substrate.

11. The method of claim 10, wherein the inert gas is supplied to the substrate in (c) through a plurality of inert gas nozzles comprising the inert gas nozzle.

12. The method of claim 1, further comprising
    (c) supplying a hydrogen gas to the substrate through a hydrogen gas nozzle different from one or more gas nozzles through which the oxygen-containing gas and the hydrogen-containing gas are supplied to the substrate.

13. The method of claim 12, wherein the hydrogen gas is supplied to the substrate in (c) through a plurality of hydrogen gas nozzles comprising the hydrogen gas nozzle.

14. A substrate processing method, comprising:
    (a) forming a first oxide layer by supplying an oxygen-containing gas and a hydrogen-containing gas to a heated substrate at a first pressure less than an atmospheric pressure and by oxidizing a surface of the substrate to transform a first surface portion of the substrate into the first oxide layer;
    (b) forming a second oxide layer by supplying the oxygen-containing gas and the hydrogen-containing gas to the heated substrate at a second pressure less than the atmospheric pressure and different from the first pressure and by oxidizing the surface of the substrate to transform a second surface portion of the substrate into the second oxide layer, wherein the second surface portion is partly constituted by the first oxide layer formed in (a); and
    (c) supplying an inert gas to the substrate in (a) and (b), wherein a supply flow rate of the inert gas to the substrate in (a) is different from that of the inert gas to the substrate in (b).

15. The method of claim 1, further comprising
    (c) supplying a hydrogen gas to the substrate in (a) and (b),
    wherein a supply flow rate of the hydrogen gas to the substrate in (a) is different from that of the hydrogen gas to the substrate in (b).

16. A method of manufacturing a semiconductor device, comprising the substrate processing method of claim 1.

17. A method of manufacturing a semiconductor device, comprising the substrate processing method of claim 10.

18. A method of manufacturing a semiconductor device, comprising the substrate processing method of claim 14.

* * * * *